United States Patent
Sato et al.

(10) Patent No.: US 9,752,058 B2
(45) Date of Patent: Sep. 5, 2017

(54) ELECTRICALLY CONDUCTIVE ADHESIVE AGENT, AND METHOD FOR CONNECTING ELECTRONIC COMPONENT

(71) Applicant: DEXERIALS CORPORATION, Tokyo (JP)

(72) Inventors: Daisuke Sato, Tochigi (JP); Ryosuke Odaka, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 264 days.

(21) Appl. No.: 14/363,894

(22) PCT Filed: Dec. 10, 2012

(86) PCT No.: PCT/JP2012/081931
§ 371 (c)(1),
(2) Date: Jun. 9, 2014

(87) PCT Pub. No.: WO2013/089061
PCT Pub. Date: Jun. 20, 2013

(65) Prior Publication Data
US 2014/0318709 A1    Oct. 30, 2014

(30) Foreign Application Priority Data
Dec. 15, 2011 (JP) ................. 2011-274841

(51) Int. Cl.
| | | |
|---|---|---|
| C09J 4/00 | (2006.01) |
| C09J 4/06 | (2006.01) |
| C09J 5/06 | (2006.01) |
| C09J 9/02 | (2006.01) |
| C09J 11/04 | (2006.01) |
| H01B 1/22 | (2006.01) |
| H05K 3/32 | (2006.01) |
| H05K 3/36 | (2006.01) |
| C09J 133/14 | (2006.01) |
| H01B 13/00 | (2006.01) |
| C09J 7/02 | (2006.01) |

(52) U.S. Cl.
CPC . *C09J 4/00* (2013.01); *C09J 4/06* (2013.01); *C09J 5/06* (2013.01); *C09J 7/0242* (2013.01); *C09J 9/02* (2013.01); *C09J 11/04* (2013.01); *C09J 133/14* (2013.01); *H01B 1/22* (2013.01); *H01B 13/00* (2013.01); *H05K 3/323* (2013.01); *H05K 3/361* (2013.01); *C09J 2433/00* (2013.01); *H05K 2203/0425* (2013.01)

(58) Field of Classification Search
CPC .................................. C09J 9/02; C09J 133/08
See application file for complete search history.

(56) References Cited

U.S. PATENT DOCUMENTS
2011/0110066 A1    5/2011 Yamada et al.

FOREIGN PATENT DOCUMENTS
| | | |
|---|---|---|
| JP | A-5-63355 | 3/1993 |
| JP | A-2008-19327 | 1/2008 |
| JP | 2009-111327 A1 | 5/2009 |
| JP | A-2009-277769 | 11/2009 |
| JP | A-2010-226140 | 10/2010 |
| JP | A-2011-77045 | 4/2011 |

OTHER PUBLICATIONS

Machine translation of Igarashi (JP2010-226140), Oct. 2010.*
Machine translation of Ikeda (JP2008-019327), Jan. 2008.*
Mei et al., Hewlett-Packard Journal, article 10, Aug. 1996.*
Jun. 30, 2015 Extended Search Report in European Patent Application No. 12857225.2.
International Search Report issued in International Patent Application No. PCT/JP2012/081931 dated Mar. 5, 2013 (with translation).

* cited by examiner

*Primary Examiner* — Ling Choi
*Assistant Examiner* — Thuy-Ai N Nguyen
(74) *Attorney, Agent, or Firm* — Oliff PLC

(57) ABSTRACT

There are provided an electrically conductive adhesive agent capable of providing good electrical continuity to a substrate to which a preflux treatment has been applied, and a method for connecting electronic components. The electrically conductive adhesive agent to be used includes a polymerizable acrylic compound, an organic peroxide, and the solder particles, the organic peroxide having a one minute half-life temperature lower than the solidus temperature of the solder particles. At the time of thermocompression bonding, the solder particles are crushed and an oxide film is removed, and a preflux layer on the surface of a bump is also removed by melting and flowing thereof, whereby electrical continuity is secured, and then an adhesive component is completely cured.

6 Claims, No Drawings

ELECTRICALLY CONDUCTIVE ADHESIVE AGENT, AND METHOD FOR CONNECTING ELECTRONIC COMPONENT

FIELD OF THE INVENTION

The present invention relates to an electrically conductive adhesive agent in which electrically conductive particles are dispersed, and a method for connecting an electronic component by the use of said electrically conductive adhesive agent. The present application asserts priority rights based on JP Patent Application 2011-274841 filed in Japan on Dec. 15, 2011. The total contents of disclosure of the patent application of the senior filing date are to be incorporated by reference into the present application.

BACKGROUND OF THE INVENTION

In recent years, a preflux treatment by using a resin type preflux has been applied to a substrate in order to protect a circuit portion of the substrate. However, a connection method by using an electrically conductive adhesive agent to perform compression-bonding at relatively low temperature causes a problem that a preflux layer present on a terminal prevents electrical continuity.

In order to solve this problem, there has been proposed a method for blending an organic film decomposition component, such as an acid component, into an anisotropic conductive adhesive film (for example, refer to Patent Literature 1), a method for washing and removal of a preflux with trichloroethane or the like before compression-bonding (for example, refer to Patent Literature 2), and the like.

However, the method according to Patent Literature 1 causes to limit the degree of flexibility in blending and also causes to corrode a member, such as a terminal, by the acid component or the like. Furthermore, the method according to Patent Literature 2 requires more processes to be performed, thereby increasing a production cost.

PRIOR-ART DOCUMENTS

Patent Document

PTL 1: Japanese Patent Application Laid-Open No. 2011-77045
PTL 2: Japanese Patent Application Laid-Open No. H5-63355

SUMMARY OF THE INVENTION

The present invention is proposed in view of such conventional actual circumstances, and provides an electrically conductive adhesive agent capable of providing good electrical continuity to a substrate to which a preflux treatment has been applied, and also provides a method for connecting electronic components.

The present inventors earnestly studied, and consequently found that the use of solder particles as electrically conductive particles and the use of an organic peroxide as a polymerization initiator having a one minute half-life temperature lower than the solidus temperature of the solder particles can provide good electrical continuity to a substrate to which a preflux treatment has been applied.

In other words, an electrically conductive adhesive agent according to the present invention comprises a polymerizable acrylic compound, an organic peroxide, and the solder particles, the organic peroxide having a one minute half-life temperature lower than the solidus temperature of the above-mentioned solder particles.

Also, a method for connecting electronic components according to the present invention is characterized in that an electrically conductive adhesive agent is sandwiched between an electrode of a first electronic component to which a preflux treatment has been applied and an electrode of a second electronic component, said electrically conductive adhesive agent containing a film forming resin, a polymerizable acrylic compound, an organic peroxide, and the solder particles, the above-mentioned organic peroxide having a one minute half-life temperature lower than the solidus temperature of the above-mentioned solder particles; and the first electronic component is thermally compression-bonded to the second electronic component, whereby the electrode of the first electronic component is electrically connected to the electrode of the second electronic component.

Effects of Invention

According to the present invention, the organic peroxide has a one minute half-life temperature lower than the solidus temperature of the solder particles, whereby, at the time of thermocompression bonding, the solder particles are crushed and an oxide film is removed, and a preflux layer on the surface of a bump is also removed by melting and flowing thereof, thereby securing electrical continuity, and then an adhesive component is completely cured. Thus, good electrical continuity can be provided to a substrate to which a preflux treatment has been applied.

DETAILED DESCRIPTION OF THE INVENTION

Hereinafter, an embodiment of the present invention will be described in detail in the following order.
1. Electrically conductive adhesive agent
2. Method for connecting electronic components
3. Examples

1. Electrically Conductive Adhesive Agent

In order to achieve a lower curing temperature at the time of connection and a reduction in tact time, an electrically conductive adhesive agent according to the present embodiment comprises a polymerizable acrylic compound which starts radical polymerization with the organic peroxide as a main thermosetting adhesive component.

In other words, the electrically conductive adhesive agent according to the present embodiment comprises a film forming resin, the polymerizable acrylic compound, the organic peroxide, and electrically conductive particles.

As the film forming resin, a thermoplastic elastomer, such as phenoxy resin, epoxy resin, polyester resin, polyurethane resin, polyamide, or EVA, or the like may be used. Among these, a phenoxy resin synthesized from bisphenol A and epichlorohydrin may be preferably used because of its heat-resisting property and adhesive property.

When the used amount of a film forming resin is too small, there is a tendency that a film is not formed. On the other hand, when the used amount of a film forming resin is too large, there is a tendency that a property of resin removal which is necessary for obtaining electric connection is lowered, and therefore, the used amount of the film forming resin is preferably 30 to 80% by mass, more preferably 40 to 70% by mass with respect to a resin solid content (a total of the polymerizable acrylic compound and the film forming resin).

Examples of the polymerizable acrylic compound include polyethylene glycol diacrylate, phosphate acrylate, 2-hydroxyethyl acrylate, 2-hydroxypropyl acrylate, 4-hydroxybutyl acrylate, isobutyl acrylate, t-butyl acrylate, isooctyl acrylate, bis-phenoxyethanol fluorene diacrylate, 2-acryloyloxy ethylsuccinate, lauryl acrylate, stearyl acrylate, isobornyl acrylate, tricyclodecanedimethanol dimethacrylate, cyclohexyl acrylate, tris-(2-hydroxyethyl)isocyanurate triacrylate, tetrahydrofurfuryl acrylate, o-phthalic acid diglycidyl ether acrylate, ethoxylated bisphenol A dimethacrylate, bisphenol A epoxy acrylate, urethane acrylate, epoxy acrylate, and (meth)acrylate equivalent to these. Among these, urethane acrylate, monofunctional acrylate, and the like are preferably used in combination for improvement in cohesive strength of a cured product, reliability of electrical continuity, adhesiveness, and the like.

When the used amount of the polymerizable acrylic compound is too small, there is a tendency that electrical conductivity reliability is lowered. On the other hand, when the used amount of the polymerizable acrylic compound is too large, there is a tendency that bonding strength is lowered and furthermore the film is not formed and therefore the used amount of the polymerizable acrylic compound is preferably 20 to 70% by mass, more preferably 30 to 60% by mass with respect to a resin solid content (a total of the polymerizable acrylic compound and the film forming resin).

Examples of the organic peroxide include di-(4-methylbenzoyl) peroxide (having a one minute half-life temperature of 128.2 degrees C.), di-(3-methylbenzoyl) peroxide (having a one minute half-life temperature of 131.1 degrees C.), dibenzoyl peroxide (having a one minute half-life temperature of 130.0 degrees C.), t-hexyl peroxybenzoate (having a one minute half-life temperature of 160.3 degrees C.), t-butyl peroxybenzoate (having a one minute half-life temperature of 166.8 degrees C.), diisobutyryl peroxide (having a one minute half-life temperature of 85.1 degrees C.), 1,1,3,3-tetramethylbutyl peroxy-2-ethylhexanoate (having a one minute half-life temperature of 124.3 degrees C.), dilauroyl peroxide (having a one minute half-life temperature of 116.4 degrees C.), di-(3,5,5-trimethyl hexanoyl) peroxide (having a one minute half-life temperature of 112.6 degrees C.), t-butyl peroxypivalate (having a one minute half-life temperature of 110.3 degrees C.), t-hexyl peroxypivalate (having a one minute half-life temperature of 109.1 degrees C.), t-butyl peroxyneoheptanoate (having a one minute half-life temperature of 104.6 degrees C.), t-butyl peroxyneodecanoate (having a one minute half-life temperature of 103.5 degrees C.), t-hexyl peroxyneodecanoate (having a one minute half-life temperature of 100.9 degrees C.), di-(2-ethylhexyl) peroxydicarbonate (having a one minute half-life temperature of 90.6 degrees C.), di-(4-t-butylcyclohexyl) peroxydicarbonate (having a one minute half-life temperature of 92.1 degrees C.), 1,1,3,3-tetramethylbutyl peroxyneodecanoate (having a one minute half-life temperature of 92.1 degrees C.), di-sec-butyl peroxydicarbonate (having a one minute half-life temperature of 85.1 degrees C.), di-n-propyl peroxydicarbonate (having a one minute half-life temperature of 85.1 degrees C.), and cumyl peroxyneodecanoate (having a one minute half-life temperature of 85.1 degrees C.). Two or more kinds of these may be used in combination.

When the used amount of the organic peroxide is too small, there is a tendency that the property of reactivity is lost. On the other hand, when the used amount of the organic peroxide is too large, there is a tendency that the product life of an anisotropic conductive film is lowered, and therefore the used amount of the organic peroxide is preferably 1 to 10 parts by mass, more preferably 3 to 7 parts by mass with respect to 100 parts by mass of the polymerizable acrylic compound.

In the present embodiment, there is used an organic peroxide having a one minute half-life temperature lower than the solidus temperature of the solder particles. There is more preferably used an organic peroxide having a one minute half-life temperature lower by not less than 0 degrees C. and not more than 20 degrees C. than the solidus temperature of the solder particles.

In the case where the organic peroxide has a one minute half-life temperature higher than the solidus temperature of the solder particles, even when the solder particles melt, resin curing does not proceed, and therefore good electrical continuity cannot be provided to a substrate to which a preflux treatment has been applied. On the other hand, in the case where the organic peroxide has a one minute half-life temperature lower by more than 20 degrees C. than the solidus temperature of the solder particles, curing reaction of the electrically conductive adhesive agent proceeds too rapidly at the time of thermocompression bonding, and therefore it is hard to obtain good electrical continuity under a thermocompression bonding condition of low pressure.

Furthermore, the organic peroxide preferably has a one minute half-life temperature of not more than 160 degrees C. Thus, good electrical continuity can be obtained under thermocompression bonding conditions of a low temperature of not more than 200 degrees C. and a low pressure of 2 to 3 MPa.

In order to lower a curing temperature, low-melting solder particles are preferably used, and examples of the low-melting solder particles include Sn(47)-Bi(53) solder particles (having a solidus temperature of 139 degrees C.), Sn(49)-In(34)-Pb(17) solder particles (having a solidus temperature of 130 degrees C.), Sn(22)-Bi(50)-Pb(28) solder particles (having a solidus temperature of 124 degrees C.), and Sn(48)-In(52) solder particles (having a solidus temperature of 117 degrees C.).

When the used amount of the solder particles is too small, there is a higher possibility that the reliability of electrical continuity becomes poor. On the other hand, when the used amount of the solder particles is too large, there is a higher possibility that short circuit is caused, and therefore, the used amount of the solder particles is preferably 0.1 to 20 parts by mass, more preferably 0.2 to 10 parts by mass with respect to 100 parts by mass of the resin solid content. Furthermore, the solder particles usually have an average particle diameter of 1 to 15 μm, more preferably 5 to 10 μm.

As another additive component constituting the electrically conductive adhesive agent according to the present embodiment, a monomer for dilution, such as various kinds of acrylic monomers, a filler, a softener, a coloring agent, a flame-retardant agent, a thixotropic agent, a coupling agent, or the like may be contained as needed.

The electrically conductive adhesive agent having such composition comprises the organic peroxide having a one minute half-life temperature lower than the solidus temperature of the solder particles, whereby, at the time of thermocompression bonding, the solder particles are crushed and an oxide film is also removed, and a preflux layer on the surface of a bump is also removed by melting and flowing thereof, thereby securing electrical continuity, and then an adhesive component is completely cured, and consequently, good electrical continuity can be obtained to a substrate to which a preflux treatment has been applied.

Furthermore, when the organic peroxide has a one minute half-life temperature lower by not less than 0 degrees C. and not more than 20 degrees C. than the solidus temperature of the solder particles, good electrical continuity can be obtained under a thermocompression bonding condition of low pressure. Moreover, when the organic peroxide has a one minute half-life temperature of not more than 160 degrees C., more specifically, not less than 80 degrees C. and not more than 160 degrees C., good electrical continuity can be obtained under thermocompression bonding conditions of a low temperature of not more than 200 degrees C. and a low pressure of 2 to 3 MPa.

Next, a method for producing the above-mentioned electrically conductive adhesive agent will be described by using an example of an anisotropic conductive film. A method for producing an anisotropic conductive film according to the present embodiment comprises an application step of applying a composite containing a film forming resin, a polymerizable acrylic compound, an organic peroxide, and solder particles on a release base material; and a drying step of drying the composite on the release base material.

In the application step, the organic peroxide having a one minute half-life temperature lower than the solidus temperature of the solder particles is blended into the composite as mentioned above, and the composite is adjusted by using an organic solvent, and then this composite is applied on the release base material, by using a bar coater, an application apparatus, or the like.

Examples of the organic solvent can be used including toluene, ethyl acetate, a mixed solvent of these, and various kinds of organic solvents. The release base material has a lamination structure obtained by, for example, applying a release agent, such as silicone, to PET (Polyethylene Terephthalate), OPP (Oriented Polypropylene), PMP (Poly-4-methylpentene-1), PTFE (Polytetrafluoroethylene), or the like, and the release base material maintains a film form of the composite.

In the subsequent drying step, the composite on the release base material is dried by a heat oven, a heat-drying apparatus, or the like. Thus, there can be obtained an anisotropic conductive film on which the above-mentioned electrically conductive adhesive agent is formed in a film state.

2. Method for Connecting Electronic Components

Next, a method for connecting electronic components by using electrically conductive adhesive agent will be described. A specific example of the method for connecting electronic components is such that an electrically conductive adhesive agent containing a film forming resin, a polymerizable acrylic compound, an organic peroxide, and solder particles, said organic peroxide having a one minute half-life temperature lower than the solidus temperature of the solder particles, is sandwiched between an electrode of a first electronic component to which a preflux treatment has been applied and an electrode of a second electronic component; and the first electronic component is thermally compression-bonded to the second electronic component, whereby the electrode of the first electronic component is electrically connected to the electrode of the second electronic component. It should be noted that a preflux treatment may be or may not be applied to the second electronic component.

In the present embodiment, the first electronic component is thermally compression-bonded to the second electronic component at a temperature higher by not less than 5 degrees C., more specifically, by not less than 5 degrees C. and not more than 30 degrees C. than the solidus temperature of the solder particles. Thus, the solder particles are crushed and an oxide film is removed, and a preflux layer on the surface of a bump is also removed by melting and flowing thereof. Furthermore, since the organic peroxide has a one minute half-life temperature lower than the solidus temperature of the solder particles, an adhesive component can be completely cured.

Furthermore, in the case of using an electrically conductive adhesive agent comprising an organic peroxide having a one minute half-life temperature lower by not less than 0 degrees C. and not more than 20 degrees C. than the solidus temperature of the solder particles, the solder particles are sufficiently crushed even at a low pressure and an oxide film is removed, and a preflux layer on the surface of a bump can be also removed by melting and flowing thereof.

Furthermore, an organic peroxide having a one minute half-life temperature of not more than 160 degrees C. allows good electrical continuity to be obtained under thermocompression bonding conditions of a low temperature of not more than 200 degrees C. and a low pressure of 2 to 3 MPa.

The electrically conductive adhesive agent according to the present embodiment may be used in various cases, but, preferably applied in a case where the first electronic component is a liquid crystal panel, a printed wired board (PWB), or the like, meanwhile, the second electronic component is a flexible printed circuit board, a tape carrier package (TCP) substrate, a chip on film (COF) substrate, or the like. Furthermore, the electrically conductive adhesive agent may be also used to connect an electrode of a solar cell to a tab lead in a solar cell module.

Furthermore, a connection structure connected by the electrically conductive adhesive agent according to the present embodiment is configured by connecting the solder particles as electrically conductive particles, and therefore has high connection reliability.

EXAMPLES

3. Examples

Hereinafter, the present invention will be specifically described with examples, but the present invention is not limited to the examples. Here, there was produced an acrylic thermosetting conductive adhesive film comprising the solder particles having a predetermined solidus temperature and an organic peroxide having a predetermined one minute half-life temperature. Then, by using this conductive adhesive film, a rigid substrate to which a preflux treatment had been applied was connected to a flexible substrate, and the continuity resistance of a thus-obtained connection structure was evaluated.

Example 1

(Production of Anisotropic Conductive Film)

A resin composite was prepared by blending 38 parts by mass of a phenoxy resin (trade name: YP50, manufactured by Toto Kasei Co., Ltd.), 20 parts by mass of a urethane acrylate (trade name: MP1600, manufactured by TOAGOSEI Co., Ltd.), 20 parts by mass of a bifunctional acrylic monomer (trade name: DCP, manufactured by Shin-Nakamura Chemical Co., Ltd.), 10 parts by mass of a monofunctional acrylic monomer (trade name: A-SA, manufactured by Shin-Nakamura Chemical Co., Ltd.), 3 parts by mass of an organic peroxide (trade name: NYPER BW, manufactured by NOF Corporation, having a one minute half-life temperature of 130 degrees C.), 2 parts by mass of a silica (trade name: RY200, manufactured by Nippon Aerosil Co., Ltd.), 10 parts by mass of a rubber component (trade name: JER-91, manufactured by Japan Epoxy Resins Co., Ltd.), 1 part by mass of a silane coupling agent (trade name: KMB503, manufactured by Shin-Etsu Chemical Co., Ltd.), and 5 parts by mass of the solder particles having an average particle diameter of 10 μm (having a solidus temperature of 139 degrees C.).

This resin composite was dissolved in and mixed with 100 parts by mass of a toluene, and then, by using a bar coater, applied to PET to which a release treatment had been applied, and dried by using an oven at 60 degrees C. for 10 minutes, whereby an anisotropic conductive film having a thickness of 30 μm was produced.

The solder particles (having a solidus temperature of 139 degrees C.) were produced as follows. By using a water atomizing method, an alloy in which Sn and Bi (Sn: 47%, Bi: 53%) was melted was atomized from a predetermined nozzle into water and rapidly cooled and solidified, whereby the solder particles having an average particle diameter of 10 μm were obtained.

(Production of Structure for Connection Reliability Evaluation and Evaluation Thereof)

Using the above-mentioned anisotropic conductive film, a rigid substrate to which a preflux treatment (also called as OSP (Organic Solderability Preservative)) had been applied was connected, under a predetermined condition, to a flexible circuit board in which a 200 μm pitch Cu wiring had been plated with Sn. The preflux treatment was conducted in such a manner that a rigid substrate was immersed for 3 to 5 minutes into a water-soluble preflux (trade name: F2LX, manufactured by Shikoku Chemicals Corporation) having a temperature of 25 to 40 degrees C., and then this rigid substrate was made to undergo a reflow at a peak top temperature of 260 degrees C. three times.

The continuity resistance of this connection structure at the initial stage and after a thermal cycle test (TCT: 1000 cycles from −55 degrees C. for 15 minutes to 125 degrees C. for 15 minutes) were measured by a four-terminal method. In the case where both the continuity resistances of a connection structure at the initial stage and after TCT were not more than 0.5Ω, the continuity resistance thereof was evaluated as ○, and otherwise it was evaluated as X.

The continuity resistance of a connection structure obtained by thermocompression bonding at 145 degrees C. and 2 MPa for 10 seconds using the anisotropic conductive film of Example 1 was evaluated as ○. On the other hand, the continuity resistance of a connection structure obtained by thermocompression bonding at 140 degrees C. and 2 MPa for 10 seconds using the anisotropic conductive film of Example 1 was evaluated as X. Table 1 shows the evaluation results of the continuity resistances.

Example 2

(Production of Anisotropic Conductive Film)

An anisotropic conductive film of Example 2 was produced in the same manner as in Example 1, except that 3 parts by mass of an organic peroxide (trade name: PEROYL L, manufactured by NOF Corporation, having a one minute half-life temperature of 116 degrees C.) were used.

(Production of Structure for Connection Reliability Evaluation and Evaluation Thereof)

The continuity resistance of a connection structure obtained by thermocompression bonding at 145 degrees C. and 2 MPa for 10 seconds using the anisotropic conductive film of Example 2 was evaluated as X. On the other hand, the continuity resistance of a connection structure obtained by thermocompression bonding at 145 degrees C. and 5 MPa for 10 seconds using the anisotropic conductive film of Example 2 was evaluated as ○. Table 1 shows the evaluation results of the continuity resistances.

Example 3

(Production of Anisotropic Conductive Film)

An anisotropic conductive film of Example 3 was produced in the same manner as in Example 1, except that 5 parts by mass of solder particles having a solidus temperature of 130 degrees C. and 3 parts by mass of an organic peroxide (trade name: PEROYL L, manufactured by NOF Corporation) having a one minute half-life temperature of 116 degrees C. were used.

The solder particles (having a solidus temperature of 130 degrees C.) were produced as follows. By using a water atomizing method, an alloy in which Sn, In, and Pb (Sn: 49%, In: 34%, Pb: 17%) was melted was atomized from a predetermined nozzle into water and rapidly cooled and solidified, whereby solder particles having an average particle diameter of 10 μm were obtained.

(Production of Structure for Connection Reliability Evaluation and Evaluation Thereof)

The continuity resistance of a connection structure obtained by thermocompression bonding at 135 degrees C. and 2 MPa for 10 seconds using the anisotropic conductive film of Example 3 was evaluated as ○. Table 1 shows the evaluation result of the continuity resistance.

Example 4

(Production of Anisotropic Conductive Film)

An anisotropic conductive film of Example 4 was produced in the same manner as in Example 1, except that 5 parts by mass of the solder particles having a solidus temperature of 130 degrees C. and 3 parts by mass of an organic peroxide (trade name: PEROYL TCP, manufactured by NOF Corporation) having a one minute half-life temperature of 92 degrees C. were used.

(Production of Structure for Connection Reliability Evaluation and Evaluation Thereof)

The continuity resistance of a connection structure obtained by thermocompression bonding at 135 degrees C. and 2 MPa for 10 seconds using the anisotropic conductive film of Example 4 was evaluated as X. On the other hand, the continuity resistance of a connection structure obtained by thermocompression bonding at 135 degrees C. and 5 MPa for 10 seconds using the anisotropic conductive film of Example 4 was evaluated as ○. Table 1 shows the evaluation results of the continuity resistances.

Comparative Example 1

(Production of Anisotropic Conductive Film)

An anisotropic conductive film of Comparative Example 1 was produced in the same manner as in Example 1, except that 3 parts by mass of an organic peroxide (trade name: PERTETRA A, manufactured by NOF Corporation) having a one minute half-life temperature of 153 degrees C. were used.

(Production of Structure for Connection Reliability Evaluation and Evaluation Thereof)

The continuity resistance of a connection structure obtained by thermocompression bonding at 145 degrees C. and 2 MPa for 10 seconds with the anisotropic conductive film of Comparative Example 1 was evaluated as X. Table 1 shows the evaluation result of the continuity resistance.

Reference Example 1

(Production of Anisotropic Conductive Film)

An anisotropic conductive film of Reference Example 1 was produced in the same manner as in Example 1, except that 5 parts by mass of Ni—Au plated resin particles (manufactured by NIPPON CHEMICAL INDUSTRIAL Co., Ltd., having an average particle diameter of 10 μm) were used in place of the solder particles.

(Production of Structure for Connection Reliability Evaluation and Evaluation Thereof)

The continuity resistance of a connection structure obtained by thermocompression bonding at 145 degrees C. and 2 MPa for 10 seconds using the anisotropic conductive film of Reference Example 1 was evaluated as X. On the other hand, the continuity resistance of a connection structure obtained by thermocompression bonding at 145 degrees C. and 2 MPa for 10 seconds using a rigid substrate to which no preflux treatment had been applied was evaluated as ○. Table 1 shows the evaluation result of the continuity resistances.

C. than the solidus temperature of the solder particles allows a preflux to be removed and also a part of the solder particles to be melted at the time of crushing the solder particles, whereby the solder wettability can be improved by a flux on the substrate.

On the other hand, as shown in Comparative Example 1, the use of an anisotropic conductive film comprising an organic peroxide having a one minute half-life temperature higher than the solidus temperature of the solder particles prevent resin curing from proceeding, whereby good electrical continuity cannot be obtained.

Furthermore, as shown in Reference Example 1, the use of Ni—Au plated resin particles as electrically conductive particles can provide good electrical continuity to a common substrate, but cannot remove a flux from a substrate to which a preflux treatment has been applied, thereby good electrical continuity to the substrate cannot be obtained.

The invention claimed is:

1. An electrically conductive adhesive agent, comprising a polymerizable acrylic compound, an organic peroxide, and solder particles,
    wherein the above-mentioned organic peroxide has a one minute half-life temperature lower by more than 0 degrees C. and not more than 20 degrees C. than a solidus temperature of the above-mentioned solder particles.

2. The electrically conductive adhesive agent according to claim 1, wherein the above-mentioned organic peroxide has a one minute half-life temperature of not more than 160 degrees C.

TABLE 1

| | Anisotropic Conductive Film | | | Compression Bonding Conditions | | |
| --- | --- | --- | --- | --- | --- | --- |
| | Electrically Conductive Particles | Organic Peroxide | | | | |
| | Particles Solidus Temperature (° C.) | One Minute Half-life Temperature (° C.) | Application of OSP Treatment | Compression Bonding Temperature (° C.) | Pressure (MPa) | Evaluation Continuity Resistance |
| Example 1 | Solder Particles | 139 | 130 | applied | 145 | 2 | ○ |
| | | | | applied | 140 | 2 | X |
| Example 2 | Solder Particles | 139 | 116 | applied | 145 | 2 | X |
| | | | | applied | 145 | 5 | ○ |
| Example 3 | Solder Particles | 130 | 116 | applied | 135 | 2 | ○ |
| Example 4 | Solder Particles | 130 | 92 | applied | 135 | 2 | X |
| | | | | applied | 135 | 5 | ○ |
| Comparative Example 1 | Solder Particles | 139 | 153 | applied | 145 | 2 | X |
| Reference Example 1 | Resin Particles | — | 130 | applied | 145 | 2 | X |
| | | | | not applied | 145 | 2 | ○ |

As shown in Examples 1 to 4, the use of an anisotropic conductive film comprising an organic peroxide having a one minute half-life temperature lower than the solidus temperature of solder particles can provide good electrical continuity to a substrate to which a preflux treatment has been applied.

Furthermore, as shown in Examples 1 and 3, the use of an anisotropic conductive film comprising an organic peroxide having a one minute half-life temperature lower by not less than 0 degrees C. and not more than 20 degrees C. than the solidus temperature of the solder particles can provide good electrical continuity to a substrate to which a preflux treatment has been applied, even under a low-pressure thermocompression bonding condition of not more than 3 MPa.

Furthermore, as shown in Example 1, thermocompression bonding at a temperature higher by not less than 5 degrees 3. A method for connecting electronic components, wherein
    an electrically conductive adhesive agent is sandwiched between an electrode of a first electronic component to which a preflux treatment is applied and an electrode of a second electronic component,
    wherein the electrically conductive adhesive agent contains a film forming resin, a polymerizable acrylic compound, an organic peroxide, and solder particles, wherein the organic peroxide has a one minute half-life temperature lower by more than 0 degrees C. and not more than 20 degrees C. than the solidus temperature of the solder particles; and
    the first electronic component is thermally compression-bonded to the second electronic component, whereby the electrode of the first electronic component is electrically connected to the electrode of the second electronic component.

4. The method for connecting electronic components according to claim 3, wherein the above-mentioned first electronic component is thermally compression-bonded to the above-mentioned second electronic component at a pressure of 2 to 3 MPa.

5. The electrically conductive adhesive agent according to claim 1, wherein the above-mentioned organic peroxide has a one minute half-life temperature of not more than 160 degrees C.

6. The method for connecting electronic components according to claim 3, wherein the above-mentioned first electronic component is thermally compression-bonded to the above-mentioned second electronic component at a pressure of 2 to 3 MPa.

* * * * *